(12) United States Patent
Li et al.

(10) Patent No.: US 10,036,778 B2
(45) Date of Patent: Jul. 31, 2018

(54) REAL-TIME POWER DISTRIBUTION METHOD AND SYSTEM FOR LITHIUM BATTERY AND REDOX FLOW BATTERY ENERGY STORAGE SYSTEMS HYBRID ENERGY STORAGE POWER STATION

(71) Applicants: ZHANGJIAKOU WIND AND SOLAR POWER ENERGY DEMONSTRATION STATION CO. LTD., STATE GRID XIN YUAN COMPANY, Hebei (CN); CHINA ELECTRIC POWER RESEARCH INSTITUTE, Beijing (CN); STATE GRID CORPORATION OF CHINA, Beijing (CN)

(72) Inventors: Xiangjun Li, Beijing (CN); Dong Hui, Beijing (CN); Xuecui Jia, Beijing (CN); Xiaokang Lai, Beijing (CN); Yinming Wang, Beijing (CN); Si Zhu, Beijing (CN)

(73) Assignees: ZHANGJIAKOU WIND AND SOLAR POWER ENERGY DEMONSTRATION STATION CO., LTD., STATE GRID XIN YUAN COMPANY, Zhangjikaou (CN); CHINA ELECTRIC POWER RESEARCH INSTITUTE, Beijing (CN); STATE GRID CORPORATION OF CHINA, Beijing (CN); Xiangjun Li, Beijing (CN); Dong Hui, Beijing (CN); Xuecui Jia, Beijing (CN); Xiaokang Lai, Beijing (CN); Yinming Wang, Beijing (CN); Si Zhu, Beijing (CN)

( * ) Notice: Subject to any disclaimer, the term of this patent is extended or adjusted under 35 U.S.C. 154(b) by 909 days.

(21) Appl. No.: 14/370,032

(22) PCT Filed: Dec. 11, 2012

(86) PCT No.: PCT/CN2012/086375
§ 371 (c)(1),
(2) Date: Jun. 30, 2014

(87) PCT Pub. No.: WO2013/097602
PCT Pub. Date: Jul. 4, 2013

(65) Prior Publication Data
US 2015/0019149 A1  Jan. 15, 2015

(30) Foreign Application Priority Data
Dec. 31, 2011 (CN) .......................... 2011 1 0460632

(51) Int. Cl.
*G01R 31/36* (2006.01)
*H02J 3/32* (2006.01)
(Continued)

(52) U.S. Cl.
CPC ..... *G01R 31/3606* (2013.01); *G01R 31/3648* (2013.01); *H01M 16/00* (2013.01);
(Continued)

(58) Field of Classification Search
USPC .......................................................... 702/63
See application file for complete search history.

(56) References Cited

U.S. PATENT DOCUMENTS

| 2007/0120530 | A1* | 5/2007 | Nozaki | ................ | B60L 3/0046 320/130 |
| 2010/0001583 | A1* | 1/2010 | Ichikawa | ............. | B60L 3/0046 307/10.1 |

(Continued)

FOREIGN PATENT DOCUMENTS

| CN | 102157985 A | 8/2011 |
| CN | 102208818 A | 10/2011 |

(Continued)

OTHER PUBLICATIONS

"International Search Report and Written Opinion dated Mar. 21, 2013," International Application No. PCT/CN2012/086375, 8 pages.

*Primary Examiner* — Paul D Lee
(74) *Attorney, Agent, or Firm* — Platinum Intellectual Property LLP

(57) ABSTRACT

The invention provides a lithium battery and redox flow battery energy storage systems hybrid energy storage power station real-time power distribution method and system. The system comprises a communication module, a data storage and management module, a gross power coordination control module and a real-time power distribution module. The said method and system not only can complete the real-time distribution of each battery energy storage units in the battery energy storage station, but also the aims of effective control and distribution of the lithium-liquid flow cell combined energy storage power station and aims of effective control and distribution of the lithium-flow flow joint energy storage power station real-time power can be achieved.

5 Claims, 2 Drawing Sheets

(51) Int. Cl.
*H02J 7/00* (2006.01)
*H02J 7/04* (2006.01)
*H01M 16/00* (2006.01)
*H02J 7/34* (2006.01)
*H01M 8/18* (2006.01)
*H01M 8/20* (2006.01)
*H01M 10/052* (2010.01)

(52) U.S. Cl.
CPC .............. *H02J 3/32* (2013.01); *H02J 7/0022* (2013.01); *H02J 7/0027* (2013.01); *H02J 7/04* (2013.01); *H01M 8/188* (2013.01); *H01M 8/20* (2013.01); *H01M 10/052* (2013.01); *H02J 7/34* (2013.01); *Y02E 40/10* (2013.01); *Y02E 60/122* (2013.01); *Y02E 60/528* (2013.01)

(56) References Cited

U.S. PATENT DOCUMENTS

| | | | | |
|---|---|---|---|---|
| 2010/0291447 | A1* | 11/2010 | Imanishi | H01M 8/04268 |
| | | | | 429/429 |
| 2012/0139522 | A1* | 6/2012 | Hasegawa | B60L 11/1887 |
| | | | | 323/311 |
| 2013/0169253 | A1* | 7/2013 | Kaneko | H01M 8/04947 |
| | | | | 323/282 |

FOREIGN PATENT DOCUMENTS

| | | |
|---|---|---|
| CN | 102214934 A | 10/2011 |
| CN | 103187807 A | 7/2013 |
| WO | 2013097602 A1 | 7/2013 |

* cited by examiner

REAL-TIME POWER DISTRIBUTION METHOD AND SYSTEM FOR LITHIUM BATTERY AND REDOX FLOW BATTERY ENERGY STORAGE SYSTEMS HYBRID ENERGY STORAGE POWER STATION

RELATED APPLICATIONS

This application is a United States National Stage Application filed under 35 U.S.C 371 of PCT Patent Application Serial No. PCT/CN2012/086375, filed Dec. 11, 2012, which claims Chinese Patent Application Serial No. 2011/10460632.2, filed Dec. 31, 2011, the disclosure of all of which are hereby incorporated by reference in their entirety.

FIELD OF THE INVENTION

The present invention relates to the smart grid and energy storage-conversion technology, and particularly to basing on high-power capacity megawatt lithium battery and redox flow battery energy storage systems hybrid energy storage power station real-time power distribution method and system, and more especially to suiting for battery power and battery energy management method of the multiple large-scale wind/photovoltaic/energy storage hybrid power system.

BACKGROUND OF THE INVENTION

National wind/photovoltaic/energy storage and transmission demonstration project is first pilot project of the State Grid Corporation strong smart grid construction, which is the largest four-in-one renewable energy comprehensive demonstration project of the world today, including wind power, photovoltaic power, energy storage and transmission to achieve "grid-friendly" new energy generation as the goal, and to reflect the "advanced technology, scientific and technological innovation, demonstration projects, economic rationality" as features, wherein, National wind/photovoltaic/energy storage and transmission demonstration project (A) plans to build wind power device 100 MW, PV device 40 MW and energy storage device 20 MW (including 14 MW of lithium iron phosphate energy storage systems, 2 MW of vanadium redox flow battery energy storage system, 4 MW of sodium sulfur battery energy storage system).

With lithium-ion batteries, redox flow batteries, sodium sulfur batteries and integrated technology continues to develop, applying lithium battery and redox flow battery energy storage systems hybrid energy storage power station to achieve a variety of applications of a smooth wind/photovoltaic/energy output, tracking program generation, participating in system FM, cutting peak and filling valley, transient active power outputting emergency response, transient voltage emergency support, etc., this has become a feasible solution, of which the key problem is that master the comprehensive integration and control technology of the multiple large-scale battery energy storage power station.

From the perspective of energy storage battery, over charging and over-discharging will affect the life of the battery. Therefore, monitoring the battery state of charge, with a reasonable distribution of total power demand in energy storage power station, and the battery state of charge control in a certain range is necessary. In high power redox flow battery energy storage system, flow battery energy storage system's internal power consumption (hereinafter referred to as consumption) is a real problem that must be considered. Taking a 175 kilowatts redox flow battery energy storage units for example, when in the system hot standby state, in order to maintain the redox flow battery energy storage units to work, there is about 11% of the system consumption, and powered by the grid side to compensate. Moreover, with the AC grid side charging and discharging power changes, the system consumption is changed.

In the lithium battery and redox flow battery energy storage systems hybrid energy storage power station, it is the core problem how to conduct real-time power distribution and storage of energy. Currently, there is no disclosing it in patents, literatures, technical reports and others about total power real-time control and energy management of the lithium battery and redox flow battery energy storage systems hybrid energy storage power station. Therefore, the present invention provides the core technology of the multiple types large-scale battery energy storage power station comprehensive control and grid operation, to solve the key issues of large-scale battery storage power stations coordinated control and energy management.

SUMMARY OF THE INVENTION

For the above problems, an object of the present invention is to provide the lithium battery and redox flow battery energy storage systems hybrid energy storage station real-time power a method which is convenient to operate and easy to implement.

The control method of the present invention is realized by the following technical solutions:

A lithium battery and redox flow battery energy storage systems hybrid energy storage power station real-time power distribution method includes the following steps:

A. Reading and storing energy storage power station total active real-time demand value and battery station running real-time data.

B. Calculating the active power command value of lithium battery energy storage sub-station and redox flow battery energy storage sub-station, according to total active real-time demand value and running real-time data being read form the Step A.

C. Redistributing the active power command value of lithium battery energy storage sub-station and redox flow battery energy storage sub-station, and then determining the active power command value of each lithium battery energy storage unit and redox flow battery energy storage unit separately.

D. Summarizing the active power command value of each lithium battery energy storage unit and redox flow battery energy storage unit, and then output to the battery energy storage.

Further, in step A, the battery energy storage power station related running data includes: controllable state, state of charge value, maximum allowable discharging power and maximum allowable charging power etc of each lithium battery energy storage unit and redox flow battery energy storage unit.

Further, said step B includes the following steps:

B1) Filtering the energy storage power station total active real-time demand value, low-frequency part of power after filtering is the lithium battery energy storage sub-station a active power command value;

B2) Through filtering of step B1, in addition to low-frequency part of the power the rest of the power is the redox flow battery energy storage sub-station an active power command value;

B3) Judging whether the lithium battery energy storage sub-station and the redox flow battery energy storage sub-station active command value meets the maximum allowable discharging power and maximum allowable charging power constraint condition of the corresponding sub-station;

B4) If any active power command value of lithium battery energy storage sub-station or the redox flow battery energy storage sub-station violates constraint condition, then execute step B5, or end the judgment;

B5) According the energy storage power station total active real-time demand value, the maximum allowable discharging power of the lithium battery energy storage sub-station and he redox flow battery energy storage sub-station, and the maximum allowable charging power of the lithium battery energy storage sub-station and the redox flow battery energy storage sub-station to recalculate the active power command value of lithium battery energy storage sub-station or the redox flow battery energy storage sub-station which violates constraint condition in step B4;

Said the maximum allowable discharging power of the lithium battery energy storage sub-station is the sum of each the maximum allowable discharging power of the controllable lithium battery energy storage sub-station, said the maximum allowable discharging power of the lithium battery energy storage sub-station is the sum of each the maximum allowable discharging power of the controllable lithium battery energy storage sub-station, said the maximum allowable charging power of the lithium battery energy storage sub-station is the sum of each the maximum allowable charging power of the controllable lithium battery energy storage sub-station, said the maximum allowable charging power of the lithium battery energy storage sub-station is the sum of each the maximum allowable charging power of the controllable lithium battery energy storage sub-station.

Wherein the maximum allowable discharging power of the lithium battery energy storage unit is the product of the maximum allowable discharging power of the controllable lithium battery energy storage unit and its controllable state, the maximum allowable discharging power of the redox flow battery energy storage unit is the product of the controllable maximum allowable discharging power of the redox flow battery energy storage unit and its controllable state, the maximum allowable charging power of the redox flow battery energy storage unit is the product of the controllable maximum allowable charging power of the redox flow battery energy storage unit and its controllable state, the maximum allowable charging power of the redox flow battery energy storage unit is the product of the controllable maximum allowable charging power of the redox flow battery energy storage unit and its controllable state.

Further, said constraint condition in step B3 is:

When the lithium battery energy storage sub-station active command value is greater than zero, the lithium battery energy storage sub-station active command value is equal or less than the maximum allowable discharging power of the lithium battery energy storage sub-station;

When the lithium battery energy storage sub-station active command value is less than zero, the lithium battery energy storage sub-station active command value is equal or less than the absolute value of the maximum allowable charging power of the lithium battery energy storage sub-station;

When the redox flow battery energy storage sub-station active command value is greater than zero, the redox flow battery energy storage sub-station active command value is equal or less than the maximum allowable discharging power of the redox flow battery energy storage sub-station;

When the redox flow battery energy storage sub-station active command value is less than zero, the redox flow battery energy storage sub-station active command value is equal or less than the absolute value of the maximum allowable charging power of the redox flow battery energy storage sub-station.

Further, in said step B5, the method of recalculating the active power command value of lithium battery energy storage sub-station or the redox flow battery energy storage sub-station which violates constraint condition in step B4 includes:

When the energy storage power station total active real-time demand value is positive, ratio of the sum of the values of the maximum allowable discharging power of the lithium battery energy storage sub-station or the redox flow battery energy storage sub-station for the maximum allowable discharging power of the lithium battery energy storage sub-station and the redox flow battery energy storage sub-station, and then it is multiplied by total active power real-time demand value of battery energy storage station to obtain the active power demand value of lithium battery energy storage sub-station and the redox flow battery energy storage sub-station separately;

Further, in step C, first separately doing a redistribution of the active power demand value of lithium battery energy storage sub-station and the redox flow battery energy storage sub-station calculated in step B, the active power command value of each lithium battery energy storage unit and redox flow battery energy storage unit can be calculated directly; in the process of redistribution, determining whether a violation of the maximum allowable discharging power and maximum allowable charging power constraint condition of the corresponding sub-station to happen, if any, an online correction based on greedy algorithm is made, and recalculate the active power command value of each lithium battery energy storage unit and redox flow battery energy storage unit is made: or the judgment is ended.

Further, step C includes the following specific steps

Step C1, When the lithium battery energy storage sub-station active power demand value is positive, it means that lithium battery energy storage sub-station being in the discharging state, the method of calculating each lithium battery energy storage unit active power command value unit includes:

C11) Setting the number of lithium battery energy storage units being restricted to the maximum allowable discharging power in the lithium battery energy storage sub-station is M and the variable M is initialized; according to ratio of the sum of the values of state of charge of controllable lithium battery energy storage unit for state of charge of c all controllable lithium battery energy storage units in the lithium battery energy storage sub-station, And then it is multiplied by active power command value of battery energy storage sub-station, to calculate the active power command value of all lithium battery energy storage units; said state of charge of controllable lithium battery energy storage unit is the product of its state of charge and state of controllable;

C12) Judging whether the active power command value of all lithium battery energy storage units meets the constraint condition of the maximum allowable discharging power, if any, lithium battery energy storage unit violates the constraint condition, then for M=M+1, and executes step C13; Otherwise, skip to step C15;

C13) According to calculate the ratio of lithium battery energy storage unit violated the maximum allowable discharging power constraint condition for the maximum allowable discharging power of that unit, to obtain eigenvalue of the maximum allowable discharging power violated constraint condition of each lithium battery energy storage unit;

C14) Selecting lithium battery energy storage unit with maximum discharging power eigenvalue form the lithium battery energy storage units violated the maximum allowable discharging power constraint condition, if there is more than one battery energy storage unit which meets the condition, and then a battery energy storage with the maximum value of state of charge is selected, and based on the following formula there is recalculated the rest lithium battery energy storage unit active power command value which not restricted to the maximum discharging power, then skips to step C12;

$$P_{lithium j} = \frac{u_{lithium j}SOC_{lithium j}}{\sum_{j=1}^{L-M}(u_{lithium j}SOC_{lithium j})}\left(P_{lithium sub\text{-}station} - \sum_{i=1}^{M} P_{lithium i}^{maximum allowable discharging}\right)$$

C15) Judging whether the sum of each lithium battery energy storage unit power command value calculated via the above formula meets the co-ordination of supply and demand constraint condition of lithium battery energy storage sub-station active power, if can not meet the judgment condition, then the rest lithium battery energy storage unit active power command value unrestricted to the maximum discharging power is recalculated:

$$P_{lithium j} = \frac{u_j P_{lithium j}^{maximum allowable discharging}}{\sum_{j=1}^{L-M}\left(u_j P_{lithium j}^{maximum allowable discharging}\right)}$$

$$\left(P_{lithium sub\text{-}station} - \sum_{i=1}^{M} P_{lithium i}^{maximum allowable discharging}\right)$$

In step C2, when the lithium battery energy storage sub-station active power command value is negative, it means that lithium battery energy storage sub-station will be in the state of charging, and shows that the method of calculating each lithium battery energy storage unit active power command value includes:

C21) Setting the number of lithium battery energy storage units being restricted to the maximum allowable charging power in the lithium battery energy storage sub-station is N and initialized; According to ratio of the sum of the values of state of charge of controllable lithium battery energy storage unit for state of discharging of all controllable lithium battery energy storage units in the lithium battery energy storage sub-station, And then multiplied by active power command value of battery energy storage sub-station, to calculate the active power command value of all lithium battery energy storage units; said state of charge of controllable lithium battery energy storage unit is the product of its state of discharging and state of controllable.

C22) Judging whether the active power command value of all lithium battery energy storage units meets the constraint condition of the maximum allowable charging power, if any lithium battery energy storage unit violates the constraint condition, then for N=N+1, and step C23 is executed; Otherwise, skips to step C25

C23) Calculating the ratio of lithium battery energy storage unit violated the maximum allowable charging power constraint condition to the maximum allowable charging power of that unit, to obtain eigenvalue of the maximum allowable charging power violated constraint condition of each lithium battery energy storage unit, respectively.

C24) Selecting lithium battery energy storage unit with maximum charging power eigenvalue form the lithium battery energy storage units violated the maximum allowable charging power constraint condition, if there is more than one battery energy storage unit meeting the condition, and then a battery energy storage with the minimum value of state of charge is selected, and based on the following formula there is recalculated the rest lithium battery energy storage unit active power command value which not restricted to the maximum charging power, then skipping to step C12;

$$P_{lithium j} = \frac{u_{lithium j}SOD_{lithium j}}{\sum_{j=1}^{L-N}(u_{lithium j}SOD_{lithium j})}\left(P_{lithium sub\text{-}station} - \sum_{i=1}^{N} P_{lithium i}^{maximum charging power}\right)$$

C25) Judging whether the sum of each lithium battery energy storage unit power command value calculated via the above formula meets the co-ordination of supply and demand constraint condition of lithium battery energy storage sub-station active power, if cannot meet the judgment condition, then there is recalculated the rest lithium battery energy storage unit active power command value which not restricted to the maximum charging power.

$$P_{lithium j} = \frac{u_j P_{lithium j}^{maximum allowable discharging}}{\sum_{j=1}^{L-M}\left(u_j P_{lithium j}^{maximum allowable discharging}\right)}$$

$$\left(P_{lithium sub\text{-}station} - \sum_{i=1}^{M} P_{lithium i}^{maximum allowable discharging}\right)$$

Step C3, when the lithium battery energy storage sub-station active power demand value is zero, it means that lithium battery energy storage sub-station will be in the state of zero power, and all the lithium battery energy storage unit active power command value is set to zero.

Step C4, When the redox flow battery energy storage sub-station active power demand value is positive, it means that redox flow battery energy storage sub-station is in the discharging state, the method of calculating each redox flow battery energy storage unit active power command value includes:

C41) Setting the number of redox flow battery energy storage units being restricted to the maximum allowable discharging power in the redox flow battery energy storage sub-station is M' and the variable M' is initialized; According to ratio of the sum of the values of state of charge of controllable redox flow battery energy storage unit to state of charge of all controllable redox flow battery energy storage units in the redox flow battery energy storage sub-station, And then is multiplied by active power demand value of battery energy storage sub-station, to calculate the active power command value of all redox flow battery energy storage units; said state of charge of controllable redox flow battery energy storage unit is the product of its state of charge by state of controllable;

C42) Judging whether the active power command value of all redox flow battery energy storage units meets the constraint condition of the maximum allowable discharging power, if any redox flow battery energy storage unit violates the constraint condition, then for M'=M'+1, and step C43 is executed; Otherwise, skipping to step C45;

C43) According to calculate the ratio of redox flow battery energy storage unit violated the maximum allowable discharging power constraint condition to the maximum allowable discharging power of that unit, to obtain eigenvalue of the maximum allowable discharging power violated constraint condition of each redox flow battery energy storage unit;

C44) Selecting redox flow battery energy storage unit with maximum discharging power eigenvalue form the redox flow battery energy storage units violated the maximum allowable discharging power constraint condition, if there is more than one battery energy storage unit satisfied the condition, and then selecting a battery energy storage with the maximum value of state of charge, and based on the following formula there is recalculated the rest redox flow battery energy storage unit active power command value which is not restricted to the maximum discharging power, then skipping to step C42;

$$P_{redox\ flow\ j} = \frac{u_{redox\ flow\ j} SOC_{redox\ flow\ j}}{\sum_{j=1}^{R-M'} (u_{redox\ flow\ j} SOC_{redox\ flow\ j})} \left( P_{redox\ flow\ sub-station} - \sum_{i=1}^{M'} \left[ P_{redox\ flow\ i} - f_{consumption\ i}^{look-up}(P_{redox\ flow\ i}) \right] + P_{redox\ flow\ j}^{consumption} \right)$$

C45) Judging whether the sum of each redox flow battery energy storage unit power command value calculated via the above formula meets the co-ordination of supply and demand constraint condition of redox flow battery energy storage sub-station active power, if cannot meet the judgment condition, then the rest redox flow battery energy storage unit active power command value which not restricted to the maximum discharging power is recalculated;

$$P_{redox\ flow\ j} = \frac{u_{redox\ flow\ j} P_{redox\ flow\ j}^{maximum\ allowable\ discharging}}{\sum_{j=1}^{R-M'} (u_{redox\ flow\ j} P_{redox\ flow\ j}^{maximum\ allowable\ discharging})} \left( P_{redox\ flow\ sub-station} - \sum_{i=1}^{M'} \left[ P_{redox\ flow\ i} - f_{consumption\ i}^{look-up}(P_{redox\ flow\ i}) \right] + P_{redox\ flow\ j}^{consumption} \right)$$

Step C5, when the redox flow battery energy storage sub-station active power demand value is negative which means that redox flow battery energy storage sub-station will be in the state of charging, and the method of calculating each redox flow battery energy storage unit active power command value includes:

C51) Setting the number of redox flow battery energy storage units being restricted to the maximum allowable charging power in the redox flow battery energy storage sub-station is N' and initializing the variable N'; According to ratio of the sum of the values of state of charge of controllable redox flow battery energy storage unit to state of discharging of all controllable redox flow battery energy storage units in the redox flow battery energy storage sub-station, and then there is multiplied by active power demand value of battery energy storage sub-station, to calculate the active power command value of all lithium battery energy storage units; said state of charge of controllable redox flow battery energy storage unit is the product of its state of discharging by state of controllable;

C52) Judging whether the active power command value of all redox flow battery energy storage units meets the constraint condition of the maximum allowable charging power, if any redox flow battery energy storage unit violates the constraint condition, then for N'=N'+1, and executing step C53; Otherwise, skipping to step C55;

C53) According to calculate the ratio of redox flow battery energy storage unit violated the maximum allowable charging power constraint condition to the maximum allowable charging power of that unit, to obtain eigenvalue of the maximum allowable charging power violated constraint condition of each redox flow battery energy storage unit;

C54) Selecting redox flow battery energy storage unit with maximum charging power eigenvalue form the redox flow battery energy storage units violated the maximum allowable charging power constraint condition, if there is more than one battery energy storage unit satisfied the condition, and then selecting a battery energy storage with the minimum value of state of charge, and based on the following formula there is recalculated the rest redox flow battery energy storage unit active power command value which not restricted to the maximum charging power, then skipping to step C52;

$$P_{redox\ flow\ j} = \frac{u_{redox\ flow\ j} SOD_{redox\ flow\ j}}{\sum_{j=1}^{R-N'} (u_{redox\ flow\ j} SOD_{redox\ flow\ j})} \left( P_{redox\ flow\ sub-station} - \sum_{i=1}^{N'} \left[ P_{redox\ flow\ i} - f_{consumption\ i}^{look-up}(P_{redox\ flow\ i}) \right] + P_{redox\ flow\ j}^{consumption} \right)$$

C55) Judging whether the sum of each redox flow battery energy storage unit power command value calculated via the above formula meets the co-ordination of supply and demand constraint condition of redox flow battery energy storage sub-station active power, if can not meet the judgment condition, then the rest redox flow battery energy storage unit active power command value which not restricted to the maximum charging power is recalculated.

$$P_{redox\ flow\ j} = \frac{u_{redox\ flow\ j} P_{redox\ flow\ j}^{maximum\ allowable\ charging}}{\sum_{j=1}^{R-N'} (u_{redox\ flow\ j} P_{redox\ flow\ j}^{maximum\ allowable\ charging})} \left( P_{redox\ flow\ sub-station} - \right.$$

-continued $$\sum_{i=1}^{N'} \left[ P_{redox\ flowi} - f_{consumptioni}^{look-up}(P_{redox\ flowi}) \right] + P_{redox\ flow\ j}^{consumption}$$

Step C6, When the redox flow battery energy storage sub-station active power demand value is value zero, it means that redox flow battery energy storage sub-station being in the hot standby state, therefore the method of calculating each redox flow battery energy storage unit active power command value includes:

C61) Obtaining each redox flow battery energy storage unit power consumption value by the look-up table method, and basing on the state of controllable and power consumption value of each redox flow battery energy storage unit each redox flow battery energy storage unit active power command value is calculated.

C62) Judging whether the active power command value of all redox flow battery energy storage units meets the constraint condition of the maximum allowable discharging power, if any redox flow battery energy storage unit violates the constraint condition, step C63 is executed, otherwise, the judgment is ended.

C63) Basing on the following conditions, dealing with each redox flow battery energy storage unit accordingly:

If permitted to get power from the grid-side for redox flow battery energy storage unit, to maintain being in the hot standby state with zero power, that makes redox flow battery energy storage unit active power command value is value zero, and getting power from the grid-side to supply the power consumption of the redox flow battery energy storage unit.

If not permitted to get power from the grid-side for redox flow battery energy storage unit, to maintain being in the hot standby state with zero power, that makes redox flow battery energy storage unit active power command value is zero, and do stop processing for battery energy storage unit.

Where in the formula, $u_{lithiumj}$, $u_{flowj}$ is the lithium battery energy storage unit and redox flow battery energy storage unit controllable state value of sign of j; sign of j is the discharging state of lithium battery energy storage unit and redox flow battery energy storage unit, $SOC_{lithiumj}$, and $SOC_{flowj}$ is the discharging state of lithium battery energy storage unit and redox flow battery energy storage unit; $SOD_{lithiumj}=1-SOC_{lithiumj}$; $SOD_{redox\ flowj}=1-SOC_{redox\ flowj}$; $P_{lithiumi}^{maximumallowabledischarging}$ and $P_{lithiumi}^{maximumallowablecharging}$ is the maximum allowable charging power and the maximum allowable discharging power of the lithium battery energy storage unit of sign of i; $P_{lithiumsub-station}$ and $P_{flow\ sub-station}$ is the active power command value of the lithium battery energy storage sub-station and the redox flow battery energy storage sub-station; L. R is the sum of the lithium battery energy storage unit and the redox flow battery energy storage unit; $P_{redox\ flowj}^{consumption}$ is the power consumption value of the redox flow battery energy storage unit.

Further, said the maximum allowable discharging power constraint condition in step C12 is that the lithium battery energy storage unit active power command value is equal or less than the maximum allowable discharging power of the said unit; said the maximum allowable charging power constraint condition in step C22 is that the absolute value of the lithium battery energy storage unit active power command value is equal or less than the absolute value of said unit maximum allowable charging power; said the co-ordination of supply and demand constraint condition of the lithium battery energy storage sub-station in step C15 and C25 is that the sum of all the lithium battery energy storage units is equal to the active power demand of the present lithium battery energy storage sub-station; said the maximum allowable discharging power constraint condition in step C42 is that the redox flow battery energy storage unit active power command value is equal or less than the maximum allowable discharging power of the said unit; said the maximum allowable charging power constraint condition in step C52 is that the absolute value of the redox flow battery energy storage unit active power command value is equal or less than the absolute value of the said unit maximum allowable charging power; said the co-ordination of supply and demand constraint condition of the redox flow battery energy storage sub-station in step C45 and C55 is that the sum of all the redox flow battery energy storage units is equal to the active power demand of the present redox flow battery energy storage sub-station; said the maximum allowable discharging power constraint condition in step C62 is that each redox flow battery energy storage unit active power command value is equal or less than the maximum allowable discharging power of the said redox flow battery energy storage unit.

In said step D, summarizing the power command value of each lithium battery energy storage unit and each redox flow battery energy storage unit calculated by step C, which outputs to battery energy storage station, to execute power distribution of each lithium battery energy storage unit and each redox flow battery energy storage unit, and realizes the objective to control the real-time power of the lithium battery and redox flow battery energy storage systems hybrid energy storage power station.

Another object of the present invention is to provide a lithium battery and redox flow battery energy storage systems hybrid energy storage power station real-time power distribution method and system, said system includes:

Communication module is used for reading total active power real-time demand value and related running data of battery energy storage master station, and outputting the active power command value of each lithium battery energy storage unit and redox flow battery energy storage unit to the battery energy storage grid station, to realizes the power distribution of the each battery energy storage unit in the battery energy storage station;

The data storage and management module is used for storing total active power real-time demand value and related running data read by communication module, and transferring the he active power command value of each lithium battery energy storage unit and redox flow battery energy storage unit collected by the real-time power allotter to the communication module;

Gross power coordinated control module is used for real-time computing active power command value of the lithium battery energy storage sub-station and the redox flow battery energy storage sub-station; and Real-time power distributor is used for real-time distributing active power command value of the lithium battery energy storage sub-station and the redox flow battery energy storage sub-station, to determine active power command value of each lithium battery energy storage sub-station and each redox flow battery energy storage sub-station, Compared with the existing technology, the present invention achieves the advantages that:

A lithium battery and redox flow battery energy storage systems hybrid energy storage power station real-time power distribution method and system of the present invention has the advantages of easy to operate, easy to realize and master in actual application, said method and system is mainly combined allowable charging and discharging ability (refers to the maximum allowable discharging power of each lithium battery energy storage power unit and each redox flow battery energy storage power unit, the maximum allowable charging power of each lithium battery energy storage power unit and each redox flow battery energy storage power unit) which can express the real-time power character of battery energy storage unit, and the state of charge SOC which can express the character of battery joint energy storage unit Storage energy, and based on the greedy algorithm and the redox flow battery energy storage power unit system power consumption, to do a online distribution with the total active power real-time demand value of battery energy storage station, so that the real-time distribution of the total active power real-time demand of the lithium-redox flow battery energy storage station is realized, at the same time energy management and real-time control of using grid-scale battery energy storage station is realized. Said method and system takes the redox flow battery energy storage system power consumption into the consider of real-time power distribution method, not only satisfied the demands of the lithium-redox flow battery energy storage station real-time power distribution, but also solved the problem of the energy storage real-time supervision, can widely used.

DETAILED DESCRIPTION OF EMBODIMENTS

With the following drawings, the present invention will be further described.

Figure 1:
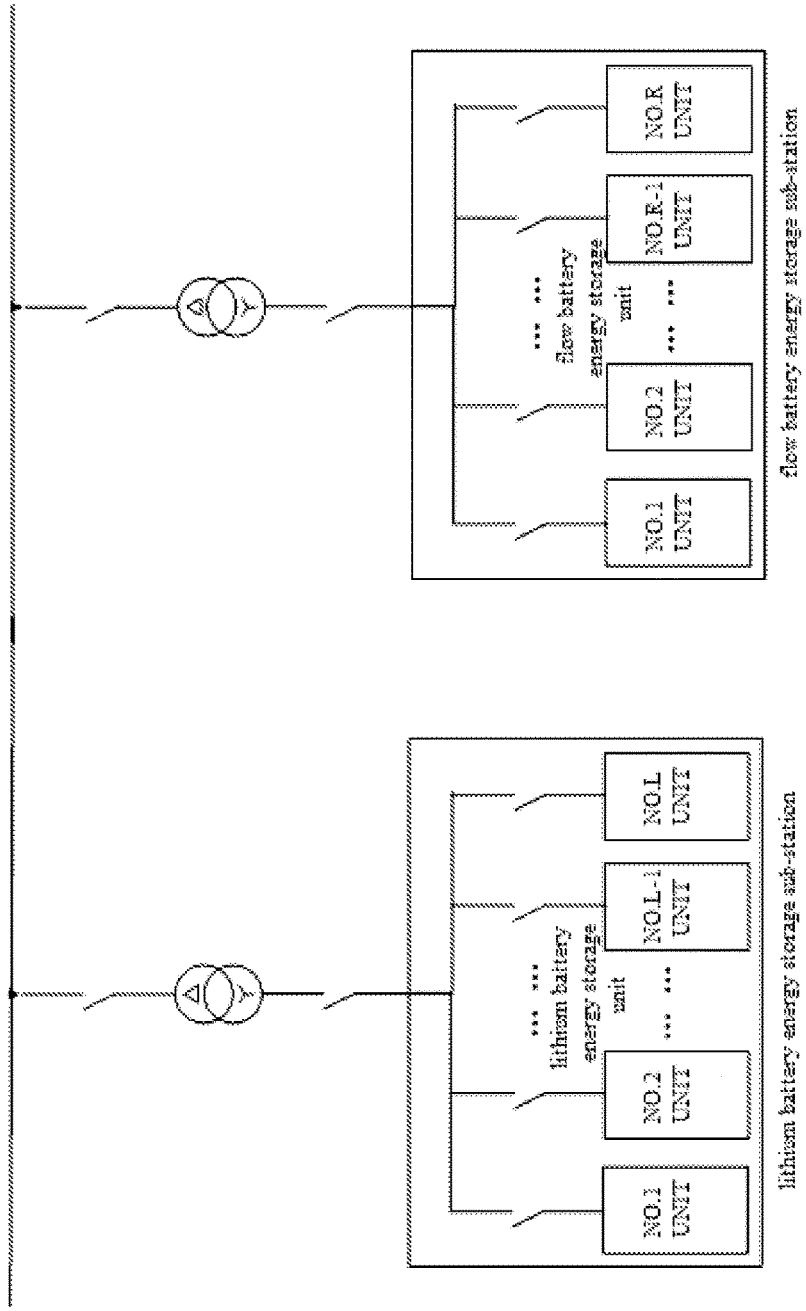
FIG. 1 is an embodiment structure schematic of a lithium battery and redox flow battery energy storage systems hybrid energy storage station in the present invention.

FIG. 1, a lithium battery and redox flow battery energy storage systems hybrid energy storage station includes the lithium battery energy storage sub-station and the redox flow battery energy storage sub-station, where in a lithium battery energy storage sub-station includes bidirectional converter and several lithium battery energy storage unit, a redox flow battery energy storage sub-station includes bidirectional converter and several redox flow battery energy storage unit, through the bidirectional converter the order of Start-stop control and the charging and discharging power with each lithium-redox flow battery energy storage unit is executed.

Figure 2:
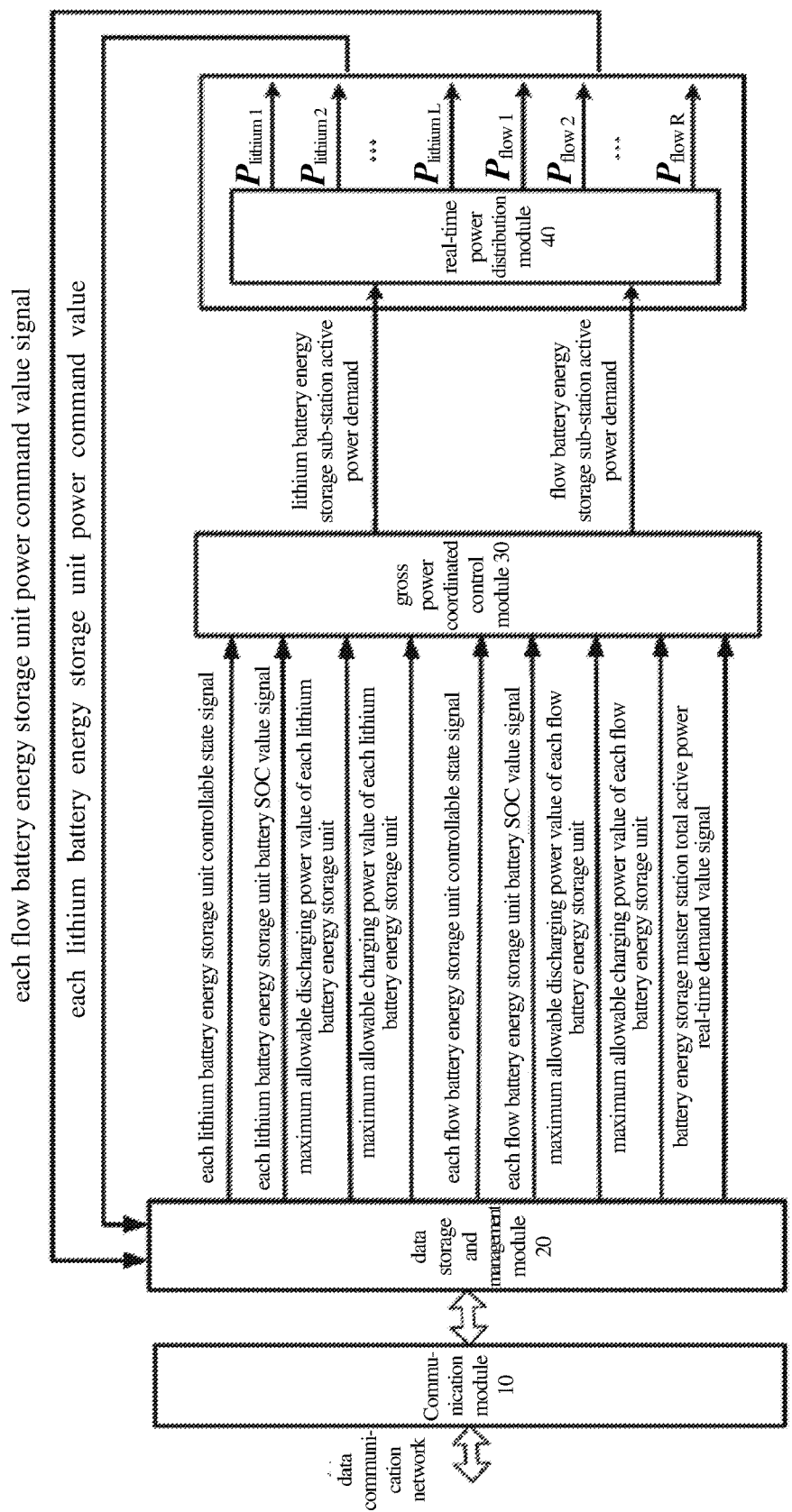
FIG. 2 is an embodiment structure diagram of a lithium battery and redox flow battery energy storage systems hybrid energy storage power station real-time power distribution system.

FIG. 2 is an embodiment structure diagram of a lithium battery and redox flow battery energy storage systems hybrid energy storage power station real-time power distribution system, as shown in FIG. 2, the technology solution of the present invention is realized with communication module 10, data storage and management module 20, gross power Coordinated control module 30, real-time power distribution module 40 settled in the remote server, where in the said control system, the communication module 10 is connected to the wired or wireless network of the lithium battery and redox flow battery energy storage systems hybrid energy storage station, to complete the interaction and communication between the said control system and lithium battery and redox flow battery energy storage systems hybrid energy storage power station, and to realize the power distribution of each lithium battery energy storage unit and each redox flow battery energy storage unit in the lithium battery and redox flow battery energy storage systems hybrid energy storage power station, and to make real-time power supervision of the lithium battery and redox flow battery energy storage systems hybrid energy storage power station Communication module 10 is used for receiving total active power real-time demand value and related running data of lithium battery and redox flow battery energy storage systems hybrid energy storage master station, and outputting the active power command value distributed to each lithium battery energy storage unit and each redox flow battery energy storage unit.

The data storage and management module 20 is used for storing and managing the real-time data and the history data of the lithium battery and redox flow battery energy storage systems hybrid energy storage power station at runtime, being in the charge of collecting the power command value of each lithium battery energy storage unit and each redox flow battery energy storage unit, and valuing the related the interface variables, for the remote server calls through the communication module.

Gross power coordinated control module 30 is used for real-time computing active power command value of the lithium battery energy storage sub-station and the flow battery energy storage sub-station; and Real-time power distribution module 40 is used for real-time distributing active power command value of the lithium battery energy storage sub-station and the redox flow battery energy storage sub-station, to determine active power command value of each lithium battery energy storage sub-station and each redox flow battery energy storage sub-station which waiting for distributing.

Wherein gross power coordinated control module includes a filter module, the first execution module and second execution module:

The said filter module is used for filtering the energy storage station total active power demand, low-frequency part of power after filtering is set as the lithium battery energy storage sub-station active power command value. And the lithium battery energy storage sub-station power command value via the first execution module is determined; After filtering, the rest of the power is set as the redox flow battery energy storage sub-station active power command value, and the redox flow battery energy storage sub-station power command value via the second execution module is determined.

Where in the first execution module includes:

The first judgment sub-module is used for judging charging and discharging state of the lithium battery energy storage sub-station: when the lithium battery energy storage sub-station active power command value is positive, it means that the lithium battery energy storage sub-station will be in the discharging state, then through the second judgment sub-module judging the lithium battery energy storage sub-station power command value; when the lithium battery energy storage sub-station active power command value is negative, it means that the lithium battery energy storage station will be in the charging state, through the third sub-module the lithium battery energy storage sub-station power command value is judged; when the lithium battery energy storage sub-station active power command value is value zero, it means that the lithium battery energy storage station will be in the zero-power state, through the first calculation module each lithium battery energy storage unit power command value is set; the first calculation sub-module is used for setting the power command value of lithium battery energy storage sub-station as zero, when the lithium battery energy storage sub-station active power command value is value zero.

The second judgment sub-module is used for setting the maximum allowable discharging power constraint condition of the lithium battery energy storage sub-station, and based on the constraint condition the lithium battery energy storage sub-station active power command value is judged, if the constraint condition is violated, then through the second calculation sub-module the lithium battery energy storage sub-station power command value is recalculated; the second calculation sub-module is used for calculating power command value of the lithium battery energy storage sub-station which violates constraint condition; and The third judgment sub-module is used for setting the maximum allowable charging power constraint condition of the lithium battery energy storage sub-station, and based on the constraint condition the lithium battery energy storage sub-station active power command value is judged, if the constraint condition is violated, then through the third calculation sub-module the lithium battery energy storage sub-station power command value which violate the constrain condition is recalculated; the third calculation sub-module is used for calculating the lithium battery energy storage sub-station power command value of violating constraint condition of the lithium battery energy storage sub-station maximum allowable charging power;

Wherein the said the second execution module includes:

The forth judgment sub-module is used for judging charging and discharging state of the battery energy storage sub-station: when the redox flow battery energy storage sub-station active power command value is positive, it means that the redox flow battery energy storage sub-station will be in the discharging state, then through the fifth judgment sub-module the redox flow battery energy storage sub-station power command value is judged; when the redox flow battery energy storage sub-station active power command value is negative, it means that the redox flow battery energy storage station will be in the charging state, through the sixth judgment sub-module the redox flow battery energy storage sub-station power command value is judged; when the redox flow battery energy storage sub-station active power command value is zero, it means that the redox flow battery energy storage station will be in the zero-power state, through the forth calculation module each redox flow battery energy storage unit power command value is set; the forth calculation sub-module is used for calculating of power command value of the redox flow battery energy storage sub-station, when the redox flow battery energy storage sub-station active power command value is zero;

The fifth judgment sub-module is used for setting the maximum allowable discharging power constraint condition of the redox flow battery energy storage sub-station, and based on the constraint condition the redox flow battery energy storage sub-station active power command value is judged, if constraint condition is violated, then through the fifth calculation sub-module the redox flow battery energy storage sub-station power command value is recalculated; the fifth calculation sub-module is used for calculating the redox flow battery energy storage sub-station power command value which violates constraint condition of the redox flow battery energy storage sub-station maximum allowable discharging power; and The sixth judgment sub-module is used for setting the maximum allowable charging power constraint condition of the redox flow battery energy storage sub-station, and based on the constraint condition the redox flow battery energy storage sub-station active power command value is judged, if it violates constraint condition, then through the sixth calculation sub-module the redox flow battery energy storage sub-station power command value is recalculated; the sixth calculation sub-module is used for calculating the redox flow battery energy storage sub-station power command value which violates constraint condition of the redox flow battery energy storage sub-station maximum allowable charging power;

Wherein the said the real-time power distributor module includes:

The Seventh judgment sub-module is used for judging charging and discharging state of the lithium battery energy storage sub-station: when the lithium battery energy storage sub-station active power command value is positive, then through the third execution sub-module the lithium battery energy storage sub-station power command value is calculated; when the lithium battery energy storage sub-station active power command value is negative, it means that the lithium battery energy storage station will be in the charging state, the forth execution sub-module calculates the lithium battery energy storage sub-station power command value; when the lithium battery energy storage sub-station active power command value is zero, it means that the lithium battery energy storage station will be in the zero-power state, the forth calculation module sets each redox flow battery energy storage unit power command value; then the fifth execution sub-module sets each lithium battery energy storage sub-station as zero;

The third execution module is used for calculating each lithium battery energy storage unit power command value when the lithium battery energy storage sub-station active power command value is positive;

The fourth execution module is used for calculating each lithium battery energy storage unit power command value when the lithium battery energy storage sub-station active power command value is negative;

The fifth execution module is used for setting all lithium battery energy storage unit power command value as zero directly Wherein the said third execution module includes:

The seventh calculation sub-module is uses for preliminary-calculating the lithium battery energy storage unit power command value when the lithium battery energy storage sub-station active power command value is positive;

The eighth judgment sub-module is used for setting the maximum allowable discharging power constraint condition of the lithium battery energy storage sub-station, and based on the constraint condition the lithium battery energy storage sub-station active power command value is judged, if it violates constraint condition, then the eighth calculation sub-module recalculates the lithium battery energy storage sub-station power command value; and then continues to make a judgment through that sub-module, the judgment is ended until all the lithium battery energy storage unit power command value meet the maximum allowable discharging power constraint condition.

the eighth calculation sub-module is used for calculating the eigen value of each battery energy storage unit violated the maximum allowable discharging power constraint condition, and for selecting one battery energy storage unit form each battery energy storage unit which violates the maximum allowable discharging power constraint condition based on greedy algorithm, maximum allowable discharging power of that unit is set as its power command value, recalculating the rest battery energy storage unit active power command value which not restricted to the maximum discharging power.

The ninth judgment sub-module is used for setting the co-ordination of supply and demand constraint condition of the lithium battery energy storage sub-station active power when the lithium battery energy storage sub-station active power value is positive, and based on the constraint condition, the sum of all the lithium battery energy storage units is judged, if it violates the constraint condition, then the ninth calculation sub-module recalculates each lithium battery energy storage unit power command value; and The ninth calculation sub-module is used for calculating each rest lithium battery energy storage unit active power command value which not restricted to the maximum discharging power, to finally determine each lithium battery energy storage unit active power command value.

The said forth execution module includes:

The tenth calculation sub-module is used for preliminary-calculating the lithium battery energy storage unit power command value when the lithium battery energy storage sub-station active power command value is negative;

The tenth judgment sub-module is used for setting the maximum allowable charging power constraint condition of the lithium battery energy storage sub-station, and based on the constraint condition the lithium battery energy storage sub-station active power command value is judged, if it violates constraint condition, then the eleventh calculation sub-module recalculates the lithium battery energy storage sub-station power command value; and then continuing to make a judgment through that sub-module, ending the judgment until all the lithium battery energy storage unit power command value meet the maximum allowable discharging power constraint condition;

The eleventh calculation sub-module is used for calculating the eigenvalue of each battery energy storage unit which violates the maximum allowable charging power constraint condition, and selecting one battery energy storage unit form each battery energy storage unit which violates the maximum allowable charging power constraint condition based on greedy algorithm, and setting maximum allowable discharging power of that unit as its power command value, recalculating the rest battery energy storage unit active power command value which not restricted to the maximum charging power;

The eleventh judgment sub-module is used for setting the co-ordination of supply and demand constraint condition of the lithium battery energy storage sub-station active power when the lithium battery energy storage sub-station active power value is negative, and based on the constraint condition, judging the sum of all the lithium battery energy storage units, if it violates constraint condition, then the twelfth calculation sub-module recalculates each lithium battery energy storage unit power command value; and The twelfth calculation sub-module is used for calculating each rest lithium battery energy storage unit active power command value which not restricted to the maximum charging power, to finally determine each lithium battery energy storage unit active power command value.

Wherein the said real-time distributor module includes:

The twelfth judgment sub-module is used for judging charging and discharging state of the redox flow battery energy storage sub-station: when the redox flow battery energy storage sub-station active power command value is positive, then the sixth execution sub-module calculates the redox flow battery energy storage sub-station power command value; when the redox flow battery energy sub-station active power command value is negative, it means that the redox flow battery energy storage station will be in the charging state, the seventh execution sub-module calculates the redox flow battery energy storage sub-station power command value; when active power command value of the redox flow battery energy storage sub-station is value zero, it means that the redox flow battery energy storage station will be in the zero-power state, the eighth execution sub-module calculates power command value of each redox flow battery storage energy unit;

The sixth execution module is used for calculating the power command value of each flow battery energy storage unit when the redox flow battery energy storage sub-station active power command value is positive;

The seventh execution module is used for calculating the power command value of each redox flow battery energy storage unit when the redox flow battery energy storage sub-station active power command value is negative;

The eight execution module is used for setting power command value of all redox flow battery energy storage unit when active power command value of redox flow battery energy storage sub-station is value zero.

Wherein said sixth execution module includes:

The thirteenth calculation sub-module is used for preliminary-calculating the redox flow battery energy storage unit power command value when the redox flow battery energy storage sub-station active power command value is positive;

The thirteenth judgment sub-module is used for setting the maximum allowable discharging power constraint condition of the redox flow battery energy storage sub-station, and based on the constraint condition judging the redox flow battery energy storage sub-station active power command value, if it violates constraint condition, then the fourteenth sub-module recalculates the redox flow battery energy storage sub-station power command value which violates it; and then it continue to make a judgment, the judgment is ended until all the redox flow battery energy storage unit power command value meet the maximum allowable discharging power constraint condition;

The fourteenth calculation sub-module is uses for calculating the eigenvalue of each redox flow battery energy storage unit which violates the maximum allowable discharging power constraint condition, and selecting one battery energy storage unit form each battery energy storage unit which violates the maximum allowable discharging power constraint condition based on greedy algorithm, maximum allowable discharging power of that unit is set as its power command value, the rest battery energy storage unit active power command value which not restricted to the maximum discharging power is recalculated.

The fourteenth judgment sub-module is used for setting the co-ordination of supply and demand constraint condition of the redox flow battery energy storage sub-station active power when the redox flow battery energy storage sub-station active power value is positive, and based on the constraint condition, judging the sum of all the redox flow battery energy storage units, if it violates constraint condition, then the fifteenth calculation sub-module recalculates each redox flow battery energy storage unit power command value;

The fifteenth calculation sub-module is used for calculating each rest redox flow battery energy storage unit active power command value which not restricted to the maximum discharging power, to finally determine each redox flow battery energy storage unit power command value.

Said seventh execution module includes:

The sixteenth calculation sub-module is used for preliminary-calculating the redox flow battery energy storage unit power command value when the redox flow battery energy storage sub-station active power command value is negative;

The sixteenth judgment sub-module is uses for setting the maximum allowable charging power constraint condition of the redox flow battery energy storage unit, and based on the constraint condition judging active power command value of the redox flow battery energy storage unit, if it violates constraint condition, then the seventeenth calculation sub-module recalculates power command value of the redox flow battery energy storage unit; and then the sub-module continues to make a judgment, ending the judgment until all the redox flow battery energy storage unit power command value meet the maximum allowable charging power constraint condition.

The seventeenth calculation sub-module is used for calculating the eigenvalue of each redox flow battery energy storage unit which violates the maximum allowable charging power constraint condition, and selecting one battery energy storage unit form each redox flow battery energy storage unit which violates the maximum allowable charging power constraint condition based on greedy algorithm, setting maximum allowable charging power of that unit as its power command value, recalculating the rest redox flow battery energy storage unit active power command value which not restricted to the maximum charging power;

The seventeenth judgment sub-module is used for setting the co-ordination of supply and demand constraint condition of the redox flow battery energy storage sub-station active power when the redox flow battery energy storage sub-station active power value is negative, and based on the constraint condition, judging the sum of all the redox flow battery energy storage units, if it violates constraint condition, then the eighteenth calculation sub-module recalculates each redox flow battery energy storage unit power command value;

The eighteenth calculation sub-module is used for calculating each rest redox flow battery energy storage unit active power command value which not restricted to the maximum charging power, to finally determine each redox flow battery energy storage unit active power command value.

Said eighth execution module includes:

The nineteenth calculation sub-module is uses for calculating each the redox flow battery energy storage unit power command value when the zero-power is in the hot standby state;

The eighteenth judgment sub-module is used for setting the maximum allowable charging power constraint condition of the redox flow battery energy storage unit, and based on the constraint condition, judging active power command value of the redox flow battery energy storage unit, if it violates constraint condition, then the ninth execution module is executed;

Said ninth execution module includes:

The nineteenth judgment sub-module is used for setting grid power supplying constraint condition, and based on the constraint condition judging the condition of the grid power supplying, if permitted to get power from the grid-side for redox flow battery energy storage unit, to maintain being in the hot standby state with zero power, the tenth execution module is executed, otherwise the eleventh module is executed; said tenth execution module is used for setting each redox flow battery energy storage unit active power command value as zero, and using the grid-side power to supply the redox flow battery energy storage unit consumption.

Said eleventh execution module, is used for setting each redox flow battery energy storage unit power command value as zero, and doing stop-processing to the redox flow battery energy storage unit.

Below are the specific implementation steps of one embodiment of the present invention.

Step A, the communication module 10 reads the data that is reading from the host computer issued a lithium battery and redox flow battery energy storage systems hybrid energy storage power station combined total active power real-time demand value and battery energy storage power station system real-time data at running time, it mainly includes: battery energy storage station total active power real-time demand value, each lithium battery energy storage unit controllable signal, each redox flow battery energy storage unit controllable signal, the SOC value signal of each lithium battery energy storage unit and each flow battery energy storage unit and the maximum allowable discharging power and the maximum allowable charging power of each lithium battery energy storage unit and each flow battery energy storage unit, etc., and then it transfers the data to the data storage and management module 20 for storage and management.

Step B, based on the gross power coordinated control module which real-time computes the active command value of the lithium storage sub-station and the redox flow battery energy storage sub-station;

Step C, based on the real-time power distribution module, which real-time distributes power command value of the lithium battery energy storage sub-station and the redox flow battery energy storage sub-station, to determine active power command value of each lithium battery energy storage sub-station and each redox flow battery energy storage sub-station.

Step D, active power command value of each lithium battery energy storage unit and each redox flow battery energy storage unit calculated by step C is collected by the data storage and management module, the communication module outputs it.

In step B, the active command value of each lithium battery energy storage unit and each redox flow battery energy storage unit is calculated as follows:

B1) Filtering the total active power real-time demand value $P_{energystoragemaster\ station}$ of the battery energy storage station based on the filtering algorithm. For example, can use weighted moving average filter or low-pass filter to control program. For example, the low-frequency part after being filtered $P_{energystoragemaster\ station}$ can be shared by the lithium the storage battery sub-station. That is, the lithium battery energy storage sub-station active command value is calculated as shown in the following equation.

$$P_{lithiumsub\text{-}station} = f_{filtering}(P_{energystoragemaster\ station}) \quad (1)$$

That is:

$$P_{lithium\ sub\text{-}station} = f_{WMA}(P_{energy\ storage\ master\ station})$$

Or $$P_{lithiumsub\text{-}station} = \frac{P_{energystoragemaster}}{1 + sT_{filtering}} \quad (2)$$

B2) The rest part of power after being filtered $P_{energystoragemaster\ station}$ can be shared by the flow the storage battery sub-station. That is, the redox flow battery energy storage sub-station active command value calculated as shown in the following equation.

$$P_{flow\ sub\text{-}station} = P_{flow\ master\ station} - f_{filtering} \quad (3)$$
$$(P_{flow\ master\ station})$$

In the formula (2), WMA represents weighted moving average, $T_{filtering}$ represents a first-order filter constant.

B3) determine whether the active power command value of the lithium battery energy storage sub-station and the redox flow battery energy storage sub-station which is listed below, $P_{lithiumsub\text{-}station}$ and $P_{flow\ sub\text{-}station}$, meets the maximum allowable charging and discharging power constraint condition of the lithium battery energy storage sub-station and the redox flow battery energy storage sub-station $$P_{lithiumsub\text{-}station} \leq \quad (4)$$
$$P_{lithiumsub\text{-}station}^{maximum\ allowable\ discharging} \quad (P_{lithium\ sub\text{-}station} \geq 0)$$

$$|P_{lithiumsub\text{-}station}| \leq |P_{lithiumsub\text{-}station}^{maximum\ allowable\ charging}| \quad (P_{lithiumsub\text{-}station} < 0) \quad (5)$$

$$P_{redox\ flow\ sub\text{-}station} \leq \quad (6)$$
$$P_{redox\ flow\ sub\text{-}station}^{maximum\ allowable\ discharging} (P_{redox\ flow\ sub\text{-}station} \geq 0)$$

$$|P_{redox\ flow\ sub\text{-}station}| \leq |P_{redox\ flow\ sub\text{-}station}^{maximum\ allowable\ charging}| \quad (7)$$
$$(P_{redox\ flow\ sub\text{-}station} < 0)$$

B4) If there is any power command value of the lithium battery energy storage sub-station or the redox flow battery energy storage sub-station which violates the above said constraint condition (4)-(7), then it executes the following step 5, otherwise it is ended.

B5) The active power command value of the lithium battery energy storage sub-station or the redox flow battery energy storage sub-station is calculated as follows:

When the battery energy storage station total active power real-time demand value $P_{energy\ storage\ master\ station}$ is positive, $$P = \frac{P_{lithium\ sub\text{-}station}^{maximum\ allowable\ dischargein}}{P_{lithium\ sub\text{-}station}^{maximum\ allowable\ discharging} + P_{flow\ sub\text{-}station}^{maximum\ allowable\ discharging}}$$
$$P_{energy\ storage\ master\ station}$$

$$P_{redox\ flowsub\text{-}station} = \frac{P_{redox\ flowsub\text{-}station}^{maximum\ allowable\ discharging}}{P_{lithium\ sub\text{-}station}^{maximum\ allowable\ discharging} + P_{redox\ flow\ sub\text{-}station}^{maximum\ allowable\ discharging}}$$
$$P_{energy\ storage\ master\ station}$$

When the battery energy storage station total active real-time demand value $P_{energy\ storage\ master\ station}$ is negative, $$P_{lithium\ sub\text{-}station} = \frac{P_{lithium\ sub\text{-}station}^{maximum\ allowable\ charging}}{P_{lithium\ sub\text{-}station}^{maximum\ allowaable\ charging} + P_{flow\ sub\text{-}station}^{maximum\ allowable\ charging}} \quad (10)$$
$$P_{energy\ storagemaster\ station}$$

$$P_{redox\ flow\ sub\text{-}station} = \quad (11)$$
$$\frac{P_{redox\ flow\ sub\text{-}station}^{maximum\ allowable\ charging}}{P_{lithium\ sub\text{-}station}^{maximum\ allowable\ charging} + P_{redox\ flowsub\text{-}station}^{maximum\ allowable\ charging}}$$
$$P_{energy\ storage\ master\ station}$$

In the formula (1)-(11), $P_{lithiumsub\text{-}station}^{maximum\ allowable\ discharging}$ is the lithium battery energy storage sub-station maximum allowable discharging power; $P_{lithiumsub\text{-}station}^{maximum\ allowable\ charging}$ is the lithium battery energy storage sub-station maximum allowable charging power; $P_{redox\ flowsub\text{-}station}^{maximum\ allowable\ charging}$ is the redox flow battery energy storage sub-station maximum allowable discharging power; $P_{redox\ flowsub\text{-}station}^{maximum\ allowable\ charging}$ is the redox flow battery energy storage sub-station maximum allowable charging power;

In step C, said active power command value of the lithium battery energy storage unit is calculated as follows:

In step C1, when the lithium battery energy storage sub-station active power demand value $P_{lithiumsub\text{-}station}$ is positive, it indicates that the lithium battery energy storage sub-station will be in the discharging state, then based on the state of charge (SOC) and the maximum allowable discharging power value of each lithium battery energy storage unit by the following steps to calculate each lithium battery energy storage unit active power command value $P_{lithiumi}$:

C11) Setting the number of lithium battery energy storage unit restricted to the maximum discharging power in the lithium battery energy storage sub-station is M=0, and the power command value of lithium battery energy storage unit i is calculated;

$$P_{lithiumi} = \frac{u_{lithiumi} SOC_{lithiumi}}{\sum_{i=1}^{L}(u_{lithiumi} SOC_{lithiumi})} P_{lithiumsub\text{-}station} \quad (12)$$

C12) Judging whether the active power $P_{lithiumi}$ each lithium battery energy storage unit i meets the following maximum allowable discharging constraint condition of the lithium battery energy storage unit:

$$P_{lithiumi} \leq P_{lithiumi}^{maximum\ allowable\ dischaging} \quad (13)$$

If there is any lithium battery energy storage unit which violates the above said constraint condition (13), then M=M+1, and the following step C13 is executed, otherwise it skips to the step C15;

C13) Based on the following equation calculating the eigenvalue which violates the maximum allowable discharging constraint condition of each lithium battery energy storage unit i:

$$\kappa_{lithiumi}^{discharging} = \frac{P_{lithiumi}}{P_{lithiumi}^{maximum\ allowable discharging}} \quad (14)$$

C14) Based on the following measurement standard, with greedy algorithm, one battery energy storage unit k is selected from the ones violates the maximum allowable discharging constraint condition. Specific implementation method is as follows: First, from corresponding unit which violates the maximum allowable discharge power constraint condition, the battery energy storage unit k with the maximum discharging power eigenvalue is found. If there are several units meeting the condition, the battery energy storage unit k with the maximum $SOC_{lithiumk}$ from the units satisfied the condition is selected.

Active power command value of the selected redox flow battery energy storage unit k is calculated as following equation:

$$P_{lithiumk} = P_{lithiumk}^{maximum\ allowable\ discharging} \quad (15)$$

The rest power command value of the lithium battery energy storage unit j which is not restricted to the maximum allowable discharging is calculated as following equation:

$$P_{lithiumj} = \frac{u_{lithiumj}SOC_{lithiumj}}{\sum_{j=1}^{L-M}(u_{lithiumj}SOC_{lithiumj})} \left(P_{lithiumsub\text{-}station} - \sum_{i=1}^{M} P_{lithiumi}^{maximumallowabledischarging}\right) \quad (16)$$

Skipping to step C12

C15) Judging whether the sum of each lithium battery energy storage unit i power command value $P_{lithiumi}$ calculated by step C11 or C14 meets the following constraint condition;

$$\sum_{i=1}^{L} P_{lithiumi} = P_{lithiumsub\text{-}station} \quad (17)$$

If the judgment indicated by equation (17) can not be satisfied, then based on the following equation the rest power command value of each lithium battery energy storage unit j which is not restricted to the maximum discharging power is recalculated:

$$P_{lithiumj} = \frac{u_j P_{lithiumj}^{maximumallowabledischarging}}{\sum_{j=1}^{L-M}(u_j P_{lithiumj}^{maximumallowabledicsharging})} \left(P_{lithiumsub\text{-}station} - \sum_{i=1}^{M} P_{lithiumi}^{maximumallowabledischarging}\right) \quad (18)$$

Step C2, when the lithium battery energy storage sub-station active power command $P_{lithiumsub\text{-}station}$ is negative, it indicates that the lithium battery energy storage sub-station will be in the charging state, then according to discharging state of each lithium battery energy storage unit and the maximum allowable charging power value, each lithium battery energy storage unit active power command value $P_{lithiumi}$ is calculated based on the following steps:

C21) Setting the number of lithium battery energy storage units being restricted to the maximum allowable charging power in the lithium battery energy storage sub-station is N−0, then calculating each lithium battery energy storage unit i power command value;

$$P_{lithium\,i} = \frac{u_{lithium\,i}SOD_{lithium\,i}}{\sum_{i=1}^{L}(u_{lithium\,i}SOD_{lithium\,i})} P_{lithium\,sub\text{-}station} \quad (19)$$

C22) Judging whether each lithium battery energy storage unit active power $P_{lithiumi}$ meets the following the maximum allowable charging power constraint condition of the battery energy storage unit.

$$|P_{lithiumi}| \leq |P_{lithiumi}^{maximumallowablecharging}| \quad (20)$$

If any lithium battery energy storage unit violates the above constraint condition as shown in equation (20), then N=N+1, and executing the following step C23; otherwise skipping to step C25.

C23) based on the following equation calculating the charging power eigenvalue of each lithium battery energy storage unit which violates the maximum allowable charging power constraint condition:

$$\kappa_{lithiumi}^{charging} = \frac{P_{lithiumi}}{P_{lithiumi}^{maximum\,allowablecharging}} \quad (21)$$

C24) Based on the following measurement standard, with greedy algorithm, selecting one battery energy storage unit k from the ones which violates the maximum allowable charging constraint condition. Specific implementation method is as follows: First, from the maximum allowable charge battery energy storage unit which violates constraint condition the battery energy storage unit k with the maximum charging power eigenvalue is found. If there are several units meeting the condition, the battery energy storage unit k with the minimum $SOC_{lithiumk}$ from the units satisfied the condition is selected.

The selected lithium battery energy storage unit k active power command value is calculated as following equation:

$$P_{lithiumk} = P_{lithiumk}^{maximumallowablecharging} \quad (22)$$

The rest power command value of the lithium battery energy storage unit j which is not restricted to the maximum allowable charging is calculated as following equation:

$$P_{lithiumj} = \frac{u_{lithiumj}SOC_{lithiumj}}{\sum_{j=1}^{L-M}(u_{lithiumj}SOC_{lithiumj})} \left(P_{lithiumsub\text{-}station} - \sum_{i=1}^{M} P_{lithiumi}^{maximum\,allowablecharging}\right) \quad (23)$$

$$SOD_{lithiumj} = 1 - SOC_{lithiumj} \quad (24)$$

Skipping to step C22,

C25) Judging whether the sum of each lithium battery energy storage unit i power command value $P_{lithiumi}$ calculated by step C21 or C24 meets the following constraint condition;

$$\sum_{i=1}^{L} P_{lithiumi} = P_{lithiumsub\text{-}station} \quad (25)$$

If the judgment indicated by equation (25) can not be satisfied, then based on the following equation recalculating the rest power command value of each lithium battery energy storage unit j which is not restricted to the maximum charging power:

$$P_{lithiumj} = \frac{u_j P_{lithiumj}^{maximum\,allowablecharging}}{\sum_{j=1}^{L-M}(u_j P_{lithiumj}^{maximum\,allowablecharging})} \left(P_{lithiumsub\text{-}station} - \sum_{i=1}^{M} P_{lithiumi}^{maximum\,allowablecharging}\right) \quad (26)$$

Equation (12)-(26), $u_{lithiumi}$ is the controllable state of the lithium battery energy storage unit i, the state is read by the step A, when the lithium battery energy storage unit is remote controlled, the state value is 1, the rest value is 0; $SOC_{lithiumi}$ is the state of charge of the lithium battery energy storage unit i; $SOD_{lithiumi}$ the discharging state of the lithium battery energy storage unit i; $P_{lithiumi}^{maximumallowabledischarging}$ is the maximum allowable discharging power of the lithium battery energy storage unit i; $P_{lithiumi}^{maximumallowablecharging}$ is the maximum allowable charging power of the lithium battery energy storage unit; N is the number of the lithium battery energy storage unit.

Step C3, when the lithium battery energy storage sub-station active power command value is value zero, it means that lithium battery energy storage sub-station will be in the state of zero power, and setting all the lithium battery energy storage unit active power command value to zero.

In step C, the said the redox flow battery energy storage unit active power command value is calculated as follows:

In step C4, when the redox flow battery energy storage sub-station active power demand value $P_{redox\ flow\ sub-station}$ is positive, it indicates that the redox flow battery energy storage sub-station will be in the discharging state, then based on the state of charge (SOC) and the maximum allowable discharging power value, active power command value $P_{redox\ flow\ i}$ of each redox flow battery energy storage unit each redox flow battery energy storage unit is calculated by the following steps:

C41) Setting the number of redox flow battery energy storage sub-station which is restricted to the maximum discharging power in the redox flow battery energy storage sub-station is M'=0, and calculating the power command value of each redox flow battery energy storage unit i;

$$P_{redox\ flow\ i} = \frac{u_{redox\ flow\ i} SOC_{redox\ flow\ i}}{\sum_{i=1}^{L}(u_{redox\ flow\ i} SOC_{redox\ flow\ i})} P_{redox\ flow\ sub-station} \quad (27)$$

C42) Judging whether the active power $P_{redox\ flow\ i}$ of each lithium battery energy storage unit i meets the following maximum allowable discharging constraint condition of the redox flow battery energy storage unit:

$$P_{redox\ flow\ i} \leq P_{redox\ flow\ i}^{maximum\ allowable\ discharging} \quad (28)$$

If there is any redox flow battery energy storage unit which violates the above said constraint condition, then M'=M'+1, and executing the following step C43, otherwise skipping to the step C45;

C43) Based on the following equation calculating the eigenvalue which violates the maximum allowable discharging power constraint condition of each redox flow battery energy storage unit i:

$$K_{redox\ flow\ i}^{discharging} = \frac{P_{redox\ flow\ i}}{P_{redox\ flow\ i}^{maximum\ allowable\ discharging}} \quad (29)$$

C44) Based on the following measurement standard, with greedy algorithm, selecting one redox flow battery energy storage unit i from the ones which violates the maximum allowable discharging constraint condition. Specific implementation method is as follows: First, the redox flow battery energy storage unit i with the maximum discharging power eigenvalue is found. If there are several units meeting the condition, the redox flow battery energy storage unit k with the maximum $SOC_{redox\ flow\ k}$ from the units which is satisfied with the condition is selected as the maximum redox flow battery energy storage unit i.

Active power command value of the selected redox flow battery energy storage unit i is calculated as following equation:

$$P_{redox\ flow\ k} = P_{redox\ flow\ k}^{maximum\ allowable\ discharging} \quad (30)$$

The rest power command value of the redox flow battery energy storage unit j which is not restricted to the maximum allowable discharging is calculated as following equation:

$$P_{redox\ flow\ j} = \frac{u_{redox\ flow\ j} SOC_{redox\ flow\ j}}{\sum_{j=1}^{R-M'}(u_{redox\ flow\ j} SOC_{redox\ flow\ j})} \left( P_{redox\ flow\ sub-station} - \sum_{i=1}^{M'} \left[ P_{redox\ flow\ i} - f_{consumption\ i}^{look-up}(P_{redox\ flow\ i}) \right] \right) + P_{redox\ flow\ j}^{consumption} \quad (31)$$

$$P_{redox\ flow\ j}^{consumption} = \quad (32)$$

$$f_{consumption\ j}^{look-up} \left\{ \frac{u_{redox\ flow\ j} SOC_{redox\ flow\ j}}{\sum_{j=1}^{R-M'}(u_{redox\ flow\ j} SOC_{redox\ flow\ j})} \left( P_{redox\ flow\ sub-station} - \sum_{i=1}^{M'} \left[ P_{redox\ flow\ i} - f_{consumption\ i}^{look-up}(P_{redox\ flow\ i}) \right] \right) \right\}$$

Skipping to step C42

C45) Judging whether the sum of each redox flow battery energy storage unit i power command value $P_{flow\ i}$ calculated by the above step meets the following constraint condition;

$$\sum_{i=1}^{L} P_{redox\ flow\ i} = P_{redox\ flow\ sub-station} \quad (33)$$

If the judgment indicated by equation (33) can not be satisfied, then based on the following equation recalculating the rest power command value of each redox flow battery energy storage unit j which is not restricted to the maximum allowable discharging power:

$$P_{redox\ flow\ j} = \frac{u_{redox\ flow\ j} P_{redox\ flow\ j}^{maximum\ allowable\ discharging}}{\sum_{j=1}^{R-M'}(u_{redox\ flow\ j} P_{redox\ flow\ j}^{maximum\ allowable\ discharging})} \left( P_{redox\ flow\ sub-station} - \sum_{i=1}^{M'} \left[ P_{redox\ flow\ i} - f_{consumption\ i}^{look-up}(P_{redox\ flow\ i}) \right] \right) + P_{redox\ flow\ j}^{consumption} \quad (34)$$

$$P_{redox\ flow\ j}^{consumption} = \qquad (35)$$

$$f_{consumption\ j}^{look-up} \left\{ \frac{u_{redox\ flow\ j}P_{redox\ flow\ j}^{maximum\ allowable\ discharging}}{\sum_{j=1}^{R-M'}\left(u_{redox\ flow\ j}P_{redox\ flow\ j}^{maximum\ allowable\ discharging}\right)} \left( \begin{array}{c} P_{redox\ flow\ sub-station} - \\ \sum_{i=1}^{M'}\left[ \begin{array}{c} P_{redox\ flow\ i} - \\ f_{consumption\ i}^{look-up}(P_{redox\ flow\ i}) \end{array} \right] \end{array} \right) + P_{redox\ flow\ i}^{consumption} \right\}$$

In equation (31)-(35), $P_{redox\ flow\ i}$ is the power command value of number M' redox flow battery energy storage unit which is restricted to the maximum discharging power.

Step 5, when the redox flow battery energy storage sub-station active power demand $P_{redox\ flow\ sub-station}$ is negative, it indicates the redox flow battery energy storage sub-station will be in the charging state, then according to discharging state of each redox flow battery energy storage unit and the maximum allowable charging power value, each redox flow battery energy storage unit active power command value $P_{redox\ flow\ i}$ based on the following steps is calculated:

C51) Setting the number of redox flow battery energy storage units being restricted to the maximum allowable charging power in the redox flow battery energy storage sub-station is N'=0, then calculating each redox flow battery energy storage unit i power command value;

$$P_{redox\ flow\ i} = \frac{u_{redox\ flow\ i}SOD_{redox\ flow\ i}}{\sum_{i=1}^{R}(u_{redox\ flow\ i}SOD_{redox\ flow\ i})}P_{redox\ flow\ sub-station} + \qquad (36)$$

$$\frac{u_{redox\ flow\ i}P_{redox\ flow\ i}^{consumption}}{}$$

$$P_{redox\ flow\ i}^{consumption} = \qquad (37)$$

$$f_{consumption\ i}^{look-up}\left(\frac{u_{redox\ flow\ i}SOD_{redox\ flow\ i}}{\sum_{i=1}^{R}(u_{redox\ flow\ i}SOD_{redox\ flow\ i})}P_{redox\ flow\ sub-station}\right)$$

C52) Judging whether each redox flow battery energy storage unit active power $P_{redox\ flow\ i}$ meets the following the maximum allowable charging power constraint condition of the battery energy storage unit.

$$|P_{redox\ flow\ i}| \leq |P_{redox\ flow\ i}^{maximum\ allowable\ charging}| \qquad (38)$$

If any redox flow battery energy storage unit violates the above constraint condition, then N'=N'+1, and executing the following step C53; otherwise it ends.

C53) Based on the following equation calculating the charging power eigenvalue of each redox flow battery energy storage unit which violates the maximum allowable charging power constraint condition:

$$K_{redox\ flow\ i}^{charging} = \frac{P_{redox\ flow\ i}}{P_{redox\ flow\ i}^{maximum\ allowable\ charging}} \qquad (39)$$

C54) Based on the following measurement standard, with greedy algorithm, one redox flow battery energy storage unit i from the ones violates the maximum allowable charging constraint condition is selected. Specific implementation method is as follows: First, from the maximum allowable charge power violate constraints the redox flow battery energy storage unit i with the maximum charging power eigenvalue is found. If there are several units meeting the condition, one redox flow battery energy storage unit i with the minimum $SOC_{redox\ flow\ i}$ from the units satisfied the condition is selected.

The selected redox flow battery energy storage unit i active power command value is calculating as following equation:

$$P_{redox\ flow\ i} = P_{redox\ flow\ i}^{maximum\ allowable\ charging} \qquad (40)$$

The rest power command value of the redox flow battery energy storage unit j which is not restricted to the maximum allowable charging is calculated as following equation:

$$P_{redox\ flow\ j} = \frac{u_{redox\ flow\ j}SOD_{redox\ flow\ j}}{\sum_{j=1}^{R-M'}(u_{redox\ flow\ j}SOD_{redox\ flow\ j})} \qquad (41)$$

$$\left( \begin{array}{c} P_{redox\ flow\ sub-station} - \\ \sum_{i=1}^{M'}\left[P_{redox\ flow\ i} - f_{consumption\ i}^{look-up}(P_{redox\ flow\ i})\right] \end{array} \right) + P_{redox\ flow\ j}^{consumption}$$

$$P_{redox\ flow\ j}^{consumption} = f_{consumption\ j}^{look-up} \left\{ \frac{u_{redox\ flow\ j}SOC_{redox\ flow\ j}}{\sum_{j=1}^{R-N'}(u_{redox\ flow\ j}SOC_{redox\ flow\ j})} \left( \begin{array}{c} P_{redox\ flow\ sub-station} - \\ \sum_{i=1}^{M'}\left[ \begin{array}{c} P_{redox\ flow\ i} - \\ f_{consumption\ i}^{look-up}(P_{redox\ flow\ i}) \end{array} \right] \end{array} \right) \right\} \qquad (42)$$

$$SOD_{redox\ flow\ j} = 1 - SOC_{redox\ flow\ j} \qquad (43)$$

Skipping to step C52.

C55) Judging whether the sum of each redox flow battery energy storage unit i power command value $P_{flow\ i}$ meets the following constraint condition;

$$\sum_{i=1}^{L} P_{redox\ flow\ i} = P_{redox\ flow\ sub-station} \qquad (44)$$

If the judgment condition indicated by equation (44) cannot be satisfied, then based on the following equation recalculating the rest power command value of each redox flow battery energy storage unit j which is not restricted to the maximum charging power;

$$P_{redox\ flow\ j} = \frac{u_{redox\ flow\ j}P_{redox\ flow\ j}^{maximum\ allowable\ charging}}{\sum_{j=1}^{R-N'}\left(u_{redox\ flow\ j}P_{redox\ flow\ j}^{maximum\ allowable\ charging}\right)} \qquad (45)$$

$$\left( \begin{array}{c} P_{redox\ flow\ sub-station} - \\ \sum_{i=1}^{N'}\left(P_{redox\ flow\ i} - f_{consumption\ i}^{look-up}(P_{redox\ flow\ i})\right) \end{array} \right) + P_{redox\ flow\ j}^{consumption}$$

-continued $$P_{redox\ flow\ j}^{consumption} = \qquad (46)$$

$$f_{consumption\ j}^{look-up} \left\{ \begin{array}{c} \dfrac{u_{redox\ flow\ j} P_{redox\ flow\ j}^{maximum\ allowable\ charging}}{\sum_{j=1}^{R-N'} \left( u_{redox\ flow\ j} P_{redox\ flow\ j}^{maximum\ allowable\ charging} \right)} \\ \left( P_{redox\ flow\ sub-station} - \sum_{i=1}^{N'} \left( P_{redox\ flow\ i} - f_{consumption\ j}^{look-up} (P_{redox\ flow\ i}) \right) \right) \end{array} \right\}$$

In equation (41)-(46), $P_{redox\ flow\ i}$ is the power command value of number N' redox flow battery energy storage unit which is restricted to the maximum allowable charging power.

Step 6, when the redox flow battery energy storage sub-station active power command $P_{redox\ flow\ sub-station}$ is value zero, it indicates that the redox flow battery energy storage sub-station will be in the zero power hot standby state, if can determine the state will not last for a long time, in order to the redox flow battery energy storage unit AC grid side active power value maintain zero, each redox flow battery energy storage unit active power command value $P_{flow\ i}$ is calculated based on the following steps:

C61) Based on the following equation calculating each redox flow battery energy storage unit i active power command value:

$$P_{redox\ flow\ i} = u_{redox\ flow\ i} P_{redox\ flow\ i}^{consumption} = u_{redox\ flow\ i} f_{consumption\ i}^{look-up}(0) \qquad (47)$$

C62) Judging whether each redox flow battery energy storage unit i active power command value $P_{redox\ flow\ i}$ meets the following maximum allowable discharging constraint condition of the redox flow battery energy storage unit.

$$P_{redox\ flow\ i} \leq P_{redox\ flow\ i}^{maximum\ allowable\ discharging} \qquad (48)$$

If any flow battery energy storage unit violates the above constraint condition, then N'=N'+1, and the following step C63 is executed; otherwise it ends.

C63) Judging based on the following judgment conditions, for processing

If allowed to take power from the grid-side to the redox flow battery energy storage unit, in order to maintain the zero-power hot standby operation state, another $P_{redox\ flow\ i}$ is zero, and the grid-side power supply is provided to the redox flow battery energy storage unit power consumption.

If not allowed to take power from the grid-side to the redox flow battery energy storage unit, in order to maintain the zero-power hot standby operation state, another $P_{redox\ flow\ i}$ zero, and do stop processing to the redox flow battery energy storage unit.

Equation (27)-(48) $u_{redox\ flow\ i}$ is the controllable state of the redox flow battery energy storage unit i, the state is read by the step A, when the redox flow battery energy storage unit is remote controlled, the state value is 1, the rest value is 0; $SOC_{redox\ flow\ i}$ is the state of charge of the redox flow battery energy storage unit i; $SOD_{redox\ flow\ i}$ is the discharging state of the redox flow battery energy storage unit i; $P_{redox\ flow\ i}^{maximum\ allowable\ discharge}$ is the maximum allowable discharging power of the redox flow battery energy storage unit i; $P_{redox\ flow\ i}^{maximum\ allowable\ charging}$ is the maximum allowable charging power of the redox flow battery energy storage unit i; R is the total number of the redox flow battery energy storage unit; $P_{redox\ flow\ i}^{consumption}$, $P_{redox\ flow\ j}^{consumption}$ is the system power consumption value of the redox flow battery energy storage unit i and unit j, said system power consumption value can be obtained by the look-up table.

The power consumption values in the formulas mentioned above all belong to the system power consumption value, in the practical implementation processing of the present invention technical solution. Through experimental method the corresponding relationship graph between the different redox flow battery energy storage system power consumption value and the charge and discharge power is determined. The experimental methods specific steps: First, manually setting the redox flow battery energy storage sub-unit charging and discharging power, respectively, in the offline comprehensive experiment to determine, the redox flow battery energy storage unit in the charging or discharging state, the corresponding relationship between the different charging and discharging power value and the system power consumption value and the redox flow battery energy storage unit system power consumption in the zero-power state. Then, based on these data, the different redox flow battery energy storage unit charts can be determined The method and system of the present invention, the IPC and communications platform complete lithium battery and redox flow battery energy storage systems hybrid energy storage power station real-time power distribution method, can achieve the purpose of lithium battery and redox flow battery energy storage systems hybrid energy storage power station real-time power effective control and distribution. With the technical solution, the present invention has a function of real-time distributing the lithium battery and redox flow battery energy storage systems hybrid energy storage power station total active power demand, real-time monitoring SOC values and other functions, and thus can be accurately, conveniently and effectively implements the lithium-flow joint battery energy storage station power real-time control function.

If only based on lithium battery and redox flow battery energy storage systems hybrid energy storage power station total power demand and each battery energy storage unit state of charge SOC, each battery energy storage units power command value of the battery energy storage power station is directly calculated, it can leads to situation which battery storage energy unit power command value exceeds the upper and lower limits of the allowable charging and discharging power (depth). Then when that may incur the situation that the battery storage energy unit power command value exceeds the upper and lower limits of the allowable charging and discharging power (depth), when this overrun occurs, if not make a timely adaptive correction and online processing, may lead to power command value exceeds the device working ability which led to the error of each battery storage unit distribution power becomes large, and there are drawbacks which difficult to meet the entire battery energy storage station total power demand;

Precisely because of the present invention increases the "by filtering method and lithium redox flow battery energy storage sub-station allowable charging and discharging power constraint condition to determine lithium redox flow battery energy storage sub-station power command value, and then based on the lithium redox flow battery energy storage sub-station power command value to determine the state of the lithium redox flow battery energy storage power station, respectively, and through corresponding control strategies and greedy algorithms to calculate each battery energy storage unit power command value of the lithium redox flow battery energy storage sub-station, while effectively consider the allowable charging and discharging power constraint condition of which can express the characteristics of the lithium redox flow battery energy storage unit real time power (i e, each lithium redox flow battery energy storage unit maximum allowable discharging power, each lithium redox flow battery energy storage unit maximum allowable discharging power and other constraint condition.) as well as the redox flow battery energy storage unit system power consumption to the control algorithms and systems" and other steps, so not only overcome the above drawbacks, but also have an better online distribution and real-time monitoring effect for each lithium battery energy storage unit and each redox flow battery energy storage unit in large-scale megawatt lithium battery and redox flow battery energy storage systems hybrid energy storage power station, more convenient for application and Implementation.

At last, in this description of the embodiments, we have detail describe the present invention according to a particular example. The detail embodiment is one example of the invention but not the only one, so the person in this field must be understand that all the alternatives and other equal and/or similar examples are all within the range of the invention and they are all consistent with the spirits of this invention, are all protected by our claims.

What is claimed is:

1. A real-time power distribution method for a lithium battery and redox flow battery hybrid energy storage power station, the said lithium battery and redox flow battery hybrid energy storage station comprising a lithium battery energy storage sub-station and a redox flow battery energy storage sub-station, wherein the lithium battery energy storage sub-station comprises bidirectional converter and lithium battery energy storage units, the redox flow battery energy storage sub-station comprises bidirectional converter and redox flow battery energy storage units, the real-time power distribution method includes the following steps:

A, reading and storing energy storage power station total active real-time demand value and battery station running real-time data;

B, according to the total active real-time demand value and running real-time data being read from Step A, calculating, using at least one of the lithium battery energy storage sub-station or the redox flow battery energy storage sub-station, the active power command value of the lithium battery energy storage sub-station and the flow battery energy storage sub-station;

C, determining, using the redox flow battery energy storage sub-station, the active power command value of the lithium battery energy storage units and the flow battery energy storage units separately;

D, summarizing, using the redox flow battery energy storage sub-station, the active power command value of each lithium battery energy storage unit and flow battery energy storage unit,; and E, controlling, using the active power command value, an optimized, real-time power distribution between the lithium battery energy storage and the redox flow battery hybrid energy storage power station;

the said step B includes the following steps:

B1) filtering the energy storage station total active power real-time demand value, wherein a low-frequency part of power after filtering is the lithium battery energy storage sub-station's active power command value;

B2) through filtering of step B1, in addition to the low-frequency part of the power the rest of the power is the flow battery energy storage sub-station active power command value;

B3) judging whether the lithium battery energy storage sub-station active command value meets a maximum allowable discharging power and maximum allowable charging power constraint condition of the corresponding sub-station, and judging whether the redox flow battery energy storage sub-station active command value meets a maximum allowable discharging power and maximum allowable charging power constraint condition of the corresponding sub-station;

B4) if any active power command value of the lithium battery energy storage sub-station or the flow battery energy storage sub-station violates the constraint condition, then executing step B5, or ending the judgment; and B5) according to the energy storage power station total active real-time demand value, the maximum allowable discharging power of the lithium battery energy storage sub-station and the flow battery energy storage sub-station, and the maximum allowable charging power of the lithium battery energy storage sub-station and the flow battery energy storage sub-station, recalculating the active power command value of the lithium battery energy storage sub-station or the flow battery energy storage sub-station which violates the constraint condition in step B4;

wherein the maximum allowable discharging power of the lithium battery energy storage sub-station is the sum of each maximum allowable discharging power of the lithium battery energy storage unit, said the maximum allowable discharging power of the redox flow battery energy storage sub-station is the sum of each the maximum allowable discharging power of the redox flow battery energy storage unit, said the maximum allowable charging power of the lithium battery energy storage sub-station is the sum of each the maximum allowable charging power of the lithium battery energy storage unit, said the maximum allowable charging power of the redox flow battery energy storage sub-station is the sum of each the maximum allowable charging power of the redox flow battery energy storage unit.

2. The real-time power distribution method according to claim 1, is characterized that, in step A, said battery station running real-time data includes: controllable state, state of charge value, maximum allowable discharging power and maximum allowable charging power of each lithium battery energy storage unit and flow battery energy storage unit.

3. The real-time power distribution method according to claim 1, is characterized that, said constraint condition in step B3 refers to:

when the lithium battery energy storage sub-station active command value is greater than zero, the lithium battery energy storage sub-station active command value is equal or less than the maximum allowable discharging power of the lithium battery energy storage sub-station;

when the lithium battery energy storage sub-station active command value is less than zero, the lithium battery energy storage sub-station active command value is equal or less than the absolute value of the maximum allowable charging power of the lithium battery energy storage sub-station;

when the flow battery energy storage sub-station active command value is greater than zero, the flow battery energy storage sub-station active command value is equal or less than the maximum allowable discharging power of the flow battery energy storage sub-station;

when the flow battery energy storage sub-station active command value is less than zero, the flow battery energy storage sub-station active command value is equal or less than the absolute value of the maximum allowable charging power of the flow battery energy storage sub-station.

4. The real-time power distribution method according to claim 1, is characterized that, said step B5, the method of recalculating the active power command value of lithium battery energy storage sub-station or the flow battery energy storage sub-station which violates constraint condition in step B4 includes:

when the energy storage power station total active real-time demand value is positive, taking a ratio of the sum of the values of the maximum allowable discharging power of the lithium battery energy storage sub-station or the flow battery energy storage sub-station to the maximum allowable discharging power of the lithium battery energy storage sub-station and the flow battery energy storage sub-station, and then multiplying it by total active power real-time demand value of battery energy storage station, and obtaining the active power demand value of the lithium battery energy storage sub-station and the flow battery energy storage sub-station separately;

when the energy storage power station total active real-time demand value is negative, taking a ratio of the sum of the values of the maximum allowable charging power of the lithium battery energy storage sub-station or the flow battery energy storage sub-station to the maximum allowable charging power of the lithium battery energy storage sub-station and the flow battery energy storage sub-station, and then multiplying it by total active power real-time demand value of battery energy storage station, and obtaining the active power demand value of the lithium battery energy storage sub-station and the flow battery energy storage sub-station separately.

5. The real-time power distribution method according to claim 1, is characterized that, in step C, first separately redistributing the active power command value of the lithium battery energy storage sub-station and the flow battery energy storage sub-station which is calculated in step B, wherein the active power command value of each lithium battery energy storage unit and flow battery energy storage unit can be calculated directly; determining whether a limit value of the maximum allowable discharging power and maximum allowable charging power of the corresponding sub-station is exceeded: if any, making an online correction based on a greedy algorithm, and recalculating the active power command value of each lithium battery energy storage unit and flow battery energy storage unit; or else ending the judgment.

* * * * *